United States Patent
Mikhalev et al.

(10) Patent No.: US 6,819,151 B2
(45) Date of Patent: Nov. 16, 2004

(54) METHOD AND CIRCUIT FOR ADJUSTING THE TIMING OF OUTPUT DATA BASED ON AN OPERATIONAL MODE OF OUTPUT DRIVERS

(75) Inventors: Vladimir Mikhalev, Boise, ID (US); Aaron M. Schoenfeld, Boise, ID (US); Daniel B. Penney, Wylie, TX (US); William C. Waldrop, Plano, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/651,602

(22) Filed: Aug. 29, 2003

(65) Prior Publication Data

US 2004/0036515 A1 Feb. 26, 2004

Related U.S. Application Data

(62) Division of application No. 10/243,279, filed on Sep. 12, 2002, now Pat. No. 6,693,472, which is a division of application No. 09/974,322, filed on Oct. 9, 2001, now Pat. No. 6,605,969.

(51) Int. Cl.[7] .............................................. H03L 7/00
(52) U.S. Cl. ...................................... 327/141; 327/149
(58) Field of Search ................................ 327/141, 149, 327/153, 155, 156, 158, 161, 276, 277, 284; 365/194, 233

(56) References Cited

U.S. PATENT DOCUMENTS

| | | | |
|---|---|---|---|
| 6,275,079 B1 | 8/2001 | Park | 327/143 |
| 6,378,079 B1 | 4/2002 | Mullarkey | 713/401 |
| 6,456,130 B1 | 9/2002 | Schnell | 327/156 |
| 6,492,852 B2 | 12/2002 | Fiscus | 327/158 |
| 6,646,937 B2 * | 11/2003 | Pochmuller | 365/201 |
| 6,670,835 B2 * | 12/2003 | Yoo | 327/158 |
| 2002/0017939 A1 | 2/2002 | Okuda et al. | 327/296 |

OTHER PUBLICATIONS

"Stub Series Terminated Logic for 2.5 V (SSTL_2) A 2.5 V Supply Voltage Based Interface Standard for Digital Integrated Circuits," JEDEC Solid State Technology Association, Electronic Industries Alliance, JEDEC Standard No. 8–9A, pp. 1–20, Dec. 2000.

\* cited by examiner

*Primary Examiner*—Linh M. Nguyen
(74) *Attorney, Agent, or Firm*—Dorsey & Whitney LLP

(57) ABSTRACT

A delay-locked loop adjusts a delay of a clock signal that is generated in response to an external clock signal. The clock signal is applied to an output buffer to clock the buffer so that data or clock signals from the buffer are synchronized with the external clock signal. The output buffer operates in a full-drive and reduced-drive mode in response to an output drive strength bit having first and second logic states, respectively. The delay-locked loop adjusts the delay of the clock signal in response to the state of the output drive strength bit to keep the data or clock signals from the buffer synchronized during both modes of operation.

8 Claims, 10 Drawing Sheets

METHOD AND CIRCUIT FOR ADJUSTING THE TIMING OF OUTPUT DATA BASED ON AN OPERATIONAL MODE OF OUTPUT DRIVERS

CROSS-REFERENCE TO RELATED APPLICATIONS

This application is a divisional of U.S. patent application Ser. No. 10/243,279, filed Sep. 12, 2002, now U.S. Pat. No. 6,693,472 which is a divisional of U.S. patent application Ser. No. 09/974,322, filed Oct. 9, 2001, issued Aug. 12, 2003 as U.S. Pat. No. 6,605,969.

TECHNICAL FIELD

The present invention relates generally to integrated circuits, and more specifically to synchronizing an external clock signal applied to an integrated circuit with internal clock signals generated in the integrated circuit in response to the external clock signal.

BACKGROUND OF THE INVENTION

In synchronous integrated circuits, the integrated circuit is clocked by an external clock signal and performs operations at predetermined times relative the rising and falling edges of the applied clock signal. Examples of synchronous integrated circuits include synchronous memory devices such as synchronous dynamic random access memories (SDRAMs), synchronous static random access memories (SSRAMs), and packetized memories like SLDRAMs and RDRAMs, and include other types of integrated circuits as well, such as microprocessors. The timing of signals external to a synchronous memory device is determined by the external clock signal, and operations within the memory device typically must be synchronized to external operations. For example, data words are placed on a data bus of the memory device in synchronism with the external clock signal, and the memory device must latch these data words at the proper times to successfully capture each data word. To latch the applied data words, an internal clock signal is developed in response to the external clock signal, and is typically applied to storage circuits such as latches contained in the memory device to thereby clock the data words into the latches. The internal clock signal and external clock must be synchronized to ensure the internal clock signal clocks the latches at the proper times to successfully capture the data words. In the present description, "external" is used to refer to signals and operations outside of the memory device, and "internal" to refer to signals and operations within the memory device. Moreover, although the present description is directed to synchronous memory devices, the principles described herein are equally applicable to other types of synchronous integrated circuits.

To synchronize external and internal clock signals in modern synchronous memory devices, a number of different clock synchronization circuits have been considered and utilized, including delay-locked loops (DLLs), phased-locked loops (PLLs), and synchronous mirror delays (SMDs), as will be appreciated by those skilled in the art. FIG. 1 is a functional block diagram illustrating a conventional delay-locked loop 100 including a variable delay line 102 that receives a clock buffer signal CLKBUF and generates a delayed clock signal CLKDEL in response to the clock buffer signal. The variable delay line 102 controls a variable delay VD of the CLKDEL signal relative to the CLKBUF signal in response to a delay adjustment signal DADJ. A feedback delay line 104 generates a feedback clock signal CLKFB in response to the CLKDEL signal, the feedback clock signal having a model delay D1+D2 relative to the CLKDEL signal. The D1 component of the model delay D1+D2 corresponds to a delay introduced by an input buffer 106 that generates the CLKBUF signal in response to an external clock signal CLK, while the D2 component of the model delay corresponds to a delay introduced by an output buffer 108 that generates a synchronized clock signal CLKSYNC in response to the CLKDEL signal. Although the input buffer 106 and output buffer 108 are illustrated as single components, each represents all components and the associated delays between the input and output of the delay-locked loop 100. The input buffer 106 thus represents the delay D1 of all components between an input that receives the CLK signal and the input to the variable delay line 102, and the output buffer 108 represents the delay D2 of all components between the output of the variable delay line and an output at which the CLKSYNC signal is developed.

The delay-locked loop 100 further includes a phase detector 110 that receives the CLKFB and CLKBUF signals and generates a delay control signal DCONT having a value indicating the phase difference between the CLKBUF and CLKFB signals. One implementation of a phase detector is described in U.S. Pat. No. 5,946,244 to Manning (Manning), which is assigned to the assignee of the present patent application and which is incorporated herein by reference. A delay controller 112 generates the DADJ signal in response to the DCONT signal from the phase detector 110, and applies the DADJ signal to the variable delay line 102 to adjust the variable delay VD. The phase detector 110 and delay controller 112 operate in combination to adjust the variable delay VD of the variable delay line 102 as a function of the detected phase between the CLKBUF and CLKFB signals.

In operation, the phase detector 110 detects the phase difference between the CLKBUF and CLKFB signals, and the phase detector and delay controller 112 operate in combination to adjust the variable delay VD of the CLKDEL signal until the phase difference between the CLKBUF and CLKFB signals is approximately zero. More specifically, as the variable delay VD of the CLKDEL signal is adjusted the phase of the CLKFB signal from the feedback delay line 104 is adjusted accordingly until the CLKFB signal has approximately the same phase as the CLKBUF signal. When the delay-locked loop 100 has adjusted the variable delay VD to a value causing the phase shift between the CLKBUF and CLKFB signals to equal approximately zero, the delay-locked loop is said to be "locked." When the delay-locked loop 100 is locked, the CLK and CLKSYNC signals are synchronized as long as the feedback delay line 104 accurately models the delays D1, D2 of the input and output buffers 106, 108, as will be discussed in more detail below. This is true because when the phase shift between the CLKBUF and CLKFB signals is approximately zero (i.e., the delay-locked loop 100 is locked), the variable delay VD has a value of NTCK−(D1+D2) as indicated in FIG. 1, where N is an integer and TCK is the period of the CLK signal. When VD equals NTCK−(D1+D2), the total delay of the CLK signal through the input buffer 106, variable delay line 102, and output buffer 108 is D1+NTCK−(D1+D2)+D2, which equals NTCK. Thus, the CLKSYNC signal is delayed by NTCK relative to the CLK signal and the two signals are synchronized since the delay is an integer multiple of the period of the CLK signal. Referring back to the discussion of synchronous memory devices above, the CLK signal corresponds to the external clock signal and the CLKSYNC signal corresponds to the internal clock signal.

FIG. 2 is a signal timing diagram illustrating various signals generated during operation of the delay-locked loop 100 of FIG. 1. In response to a rising-edge of the CLK signal at a time T0, the CLKBUF signal goes high the delay D1 later at a time T1. Initially, the variable delay VD as a value VD1, causing the CLKDEL signal to go high at a time T3 and the CLKSYNC signal to go high at a time T4. At this point, note that the positive-edge of the CLKSYNC signal at the time T4 is not synchronized with the CLK signal, which transitions high at a time T5. In response to the rising-edge of the CLKDEL signal at the time T3, the CLKFB goes high at a time T6, which occurs before a positive-edge of the CLKBUF signal occurring at a time T7. Thus, the positive-edge of the CLKFB signal occurs at the time T6 while the positive-edge of the CLKBUF occurs at the time T7, indicating there is a phase shift between the two signals. The phase detector 110 (FIG. 1) detects this phase difference, and generates the DCONT signal just after the time T7 at a time T8 which, in turn, causes the delay controller 112 (FIG. 1) to generate the DADJ signal to adjust the value of the variable delay VD to a new value VD2 and thereby synchronize the CLK and CLKSYNC signals, as depicted at a time T9. At this point, note that the variable delay VD results in an approximately zero phase difference between the CLKBUF and CLKFB signals, as indicated at a time T10.

From this description of the conventional delay-locked loop 100, it is seen that in order for the CLK and CLKSYNC signals to be accurately synchronized, the feedback delay line 104 must accurately model the delay D1 of the input buffer 106 and delay D2 of the output buffer 108. For example, if the delay D2 of the output buffer 108 has a value D2' instead of D2, the delay-locked loop 100 will be locked (i.e., phase difference between CLKBUF and CLKFB equals zero), but the CLK and CLKSYNC signals will not be synchronized, as illustrated at a time T11 in FIG. 2. In a conventional double-data rate (DDR) synchronous dynamic random access memory (SDRAM), such a situation may arise when data drivers in the memory device change from a full-drive operating mode to a reduced-drive operating mode, as will now be described in more detail. Although the principles described herein are discussed with reference to a DDR SDRAM, the principles are applicable to any memory device that may include a clock synchronization circuit for synchronizing internal and external signals, such as conventional synchronous DRAMs (SDRAMs), as well as packetized memory devices like SLDRAMs and RDRAMs, and are equally applicable to any integrated circuit that must synchronize internal and external clocking signals.

Referring back to FIG. 1, in a conventional DDR SDRAM the output buffer 108 corresponds to a data driver that receives a data signal DQ and outputs the data signal in response to being clocked by the CLKDEL signal. In this way, as long as the delay D2 of the output buffer 108 is accurately modeled by the feedback delay line 104, the output buffer outputs the DQ signal on a data bus of the DDR SDRAM in synchronism with the CLK signal. In conventional DDR SDRAMs, however, the output buffer 108 operates in either a full-drive mode or a reduced-drive mode, and the delay D2 of the output buffer can vary between modes. More specifically, in a conventional DDR SDRAM an extended load mode register includes an output drive strength bit that determines whether the output buffer 108 operates in the full-drive or reduced-drive mode of operation. A memory controller typically sets the output drive strength bit in the extended load mode register via a load mode register command to thereby place the output buffer 108 in the desired operating mode. The output buffer 108 is typically placed in the full-drive mode when the DDR SDRAM is being utilized in a conventional application, such as on a conventional memory module, while the output buffer may be placed in the reduced-drive mode when the DDR SDRAM is being utilized in a point-to-point application such as on a graphics card, as will be appreciated by those skilled in the art. During the full-drive mode, the output buffer 108 provides sufficient current to drive the DQ signals to full-range voltages for a particular loading of the data bus, while during the reduced-drive mode the buffer provides a reduced current to drive the DQ signals to reduced voltages given the same loading of the data bus, as will also be appreciated by those skilled in the art.

FIG. 3 is a signal timing diagram that illustrates the operation of the output buffer 108 in the full-drive and reduced-drive modes of operation. In the example of FIG. 3, the CLKDEL signal goes high at a time T0, which occurs the delay D2 before the CLK signal goes high at a time T1. Three signal diagrams 300–304 below the CLK and CLKDEL signals illustrate the three possible scenarios for the operation of the output buffer 108 in outputting the DQ signal when switching between the full-drive and reduced-drive mode of operation. In the first diagram 300, the output buffer 108 has substantially the same delay D2 in both the full-drive and reduced-drive modes of operation. As a result, the DQ signals in diagram 300 are output in synchronism with the CLK signal in both the modes of operation, as illustrated by the signals for both modes crossing at the time T1. In contrast, the signal diagram 302 illustrates a situation where the output buffer 108 outputs the DQ signal in synchronism with the CLK signal at the time T1 in the full-drive mode of operation, but outputs the DQ signal at a different time T2 earlier than the time T1 in the reduced-drive mode of operation. In this example, the output buffer 108 has a delay D2' that is less than the delay D2 modeled by the feedback delay line 104 (FIG. 1) in the reduced-drive mode, resulting in the DQ signal being output at the earlier time T2 relative to the CLK signal at the time T1.

The signal diagram 304 illustrates the third situation where the output buffer 108 outputs the DQ signal in synchronism with the CLK signal at the time T1 in the full-drive mode of operation, but outputs the DQ signal at a different time T3 later than the time T1 in the reduced-drive mode of operation. In this situation, output offer 108 has a delay D2' that is greater than the delay D2 modeled by the feedback delay line 104 in the reduced-drive mode, resulting in the DQ signal being output at the later time T3 relative to the CLK signal at the time T1. Thus, FIG. 3 illustrates that in a conventional DDR SDRAM the DQ signals placed on a data bus of the memory device may not be placed on the data bus in synchronism with the CLK signal when the output buffers 108 switch between full-drive and reduced-drive modes of operation. An access time TAC(MIN) and an access time TAC(MAX) are specified for the memory device, and correspond to the maximum time before and after, respectively, the transition of the CLK signal at the time T1 that the transition of the DQ signal can occur. A conventional memory device may not satisfy the access times TAC(MIN), TAC(MAX) in both the full- and reduced-drive modes of operation. In the example of FIG. 3, the signal diagram 302 illustrates a situation where the memory device does not satisfy the access time TAC(MIN) during the reduced-drive mode, while the signal diagram 304 illustrates a situation where the memory device does not satisfy the time TAC(MAX) during the reduced-drive mode.

There is a need for a outputting data and other signals in synchronism with an external clock signal in memory devices such as DDR SDRAMs that include output buffers that can operate in full-drive and reduced-drive modes of operation.

SUMMARY OF THE INVENTION

According to one aspect of the present invention, a delay-locked loop, includes a variable delay line that receives an input clock signal and generates a delayed clock signal responsive to the input clock signal. The delayed clock signal has a delay relative to the input clock signal and the variable delay circuit controls the value of the delay responsive to a delay control signal. A mode delay line receives an output drive strength signal and generates a mode delayed clock signal having a mode delay relative to the delayed clock signal. The mode delay is a function of the output drive strength signal. A feedback delay line generates a feedback clock signal responsive to the mode delayed clock signal. The feedback clock signal has a model delay relative to the mode delayed clock signal. A comparison circuit receives the input and feedback clock signals and generates the delay control signal in response to the relative phases of these clock signals.

According to another aspect of the present invention, a delay-locked loop includes a variable delay line adapted to receive an input clock signal and generate a delayed clock signal responsive to the input clock signal. The delayed clock signal has a delay relative to the input clock signal and the variable delay circuit controls the value of the delay responsive to a delay control signal. A comparison circuit receives the input clock signal and generates the delay control signal in response to the relative phases of the delayed and input clock signals. A mode delay line receives an output drive strength signal and generates a mode delayed clock signal having a mode delay relative to the delayed clock signal. The mode delay is a function of the output drive strength signal.

DETAILED DESCRIPTION OF THE INVENTION

Figure 4:
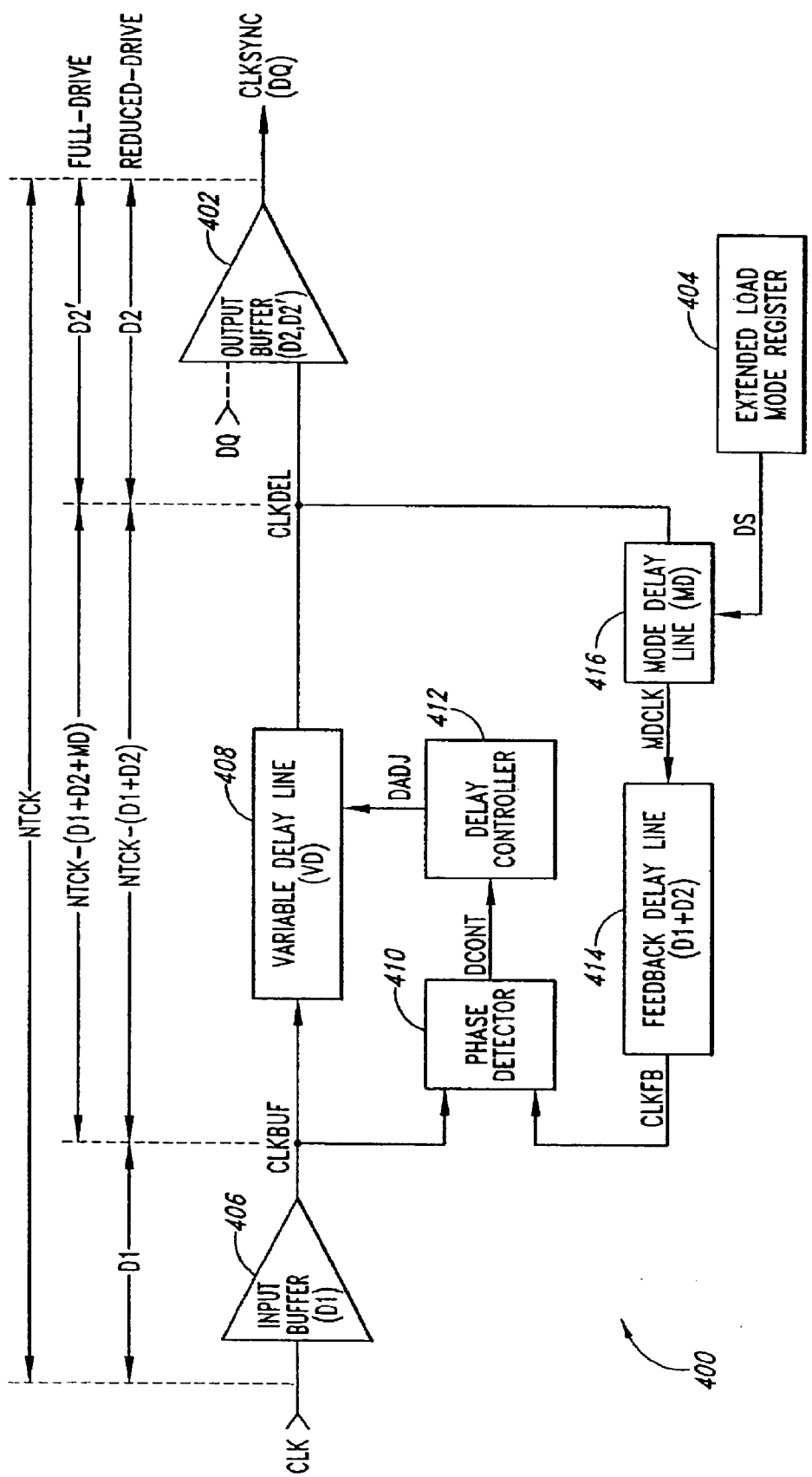
FIG. 4 is a functional block diagram illustrating a delay-locked loop for adjusting a delay of a delayed clock signal in response to an output buffer operating in either a full-drive or reduced-drive mode of operation according to one embodiment of the present invention.

FIG. 4 is a functional block diagram illustrating one embodiment of a delay-locked loop 400 that synchronizes an external clock signal CLK signal and a synchronized clock signal CLKSYNC during full- and reduced-drive modes of operation of an output buffer 402. More specifically, the delay-locked loop 400 adjusts a variable delay VD of a delayed clock signal CLKDEL in response to the state of an output drive strength bit DS stored in an extended load mode register 404 to thereby compensate for variations in a delay D2 of the output buffer 402 between the full- and reduced-drive modes of operation, with the state of the DS bit determining the mode of operation of the output buffer, as will now be explained in more detail below.

Although the following discussion describes a delayed-locked loop, other clock synchronization circuits such as an SMD may also be utilized, as will be appreciated by those skilled in the art. Moreover, any type of integrated circuit that has the need for synchronizing internal and external clock signals may utilize a clock synchronization circuit that embodies aspects of the present invention. In the following description, certain details are set forth to provide a sufficient understanding of the invention. It will be clear to one skilled in the art, however, that the invention may be practiced without these particular details. In other instances, well-known circuits, control signals, timing protocols, and software operations have not been shown in detail or omitted entirely in order to avoid unnecessarily obscuring the invention.

Figure 1:
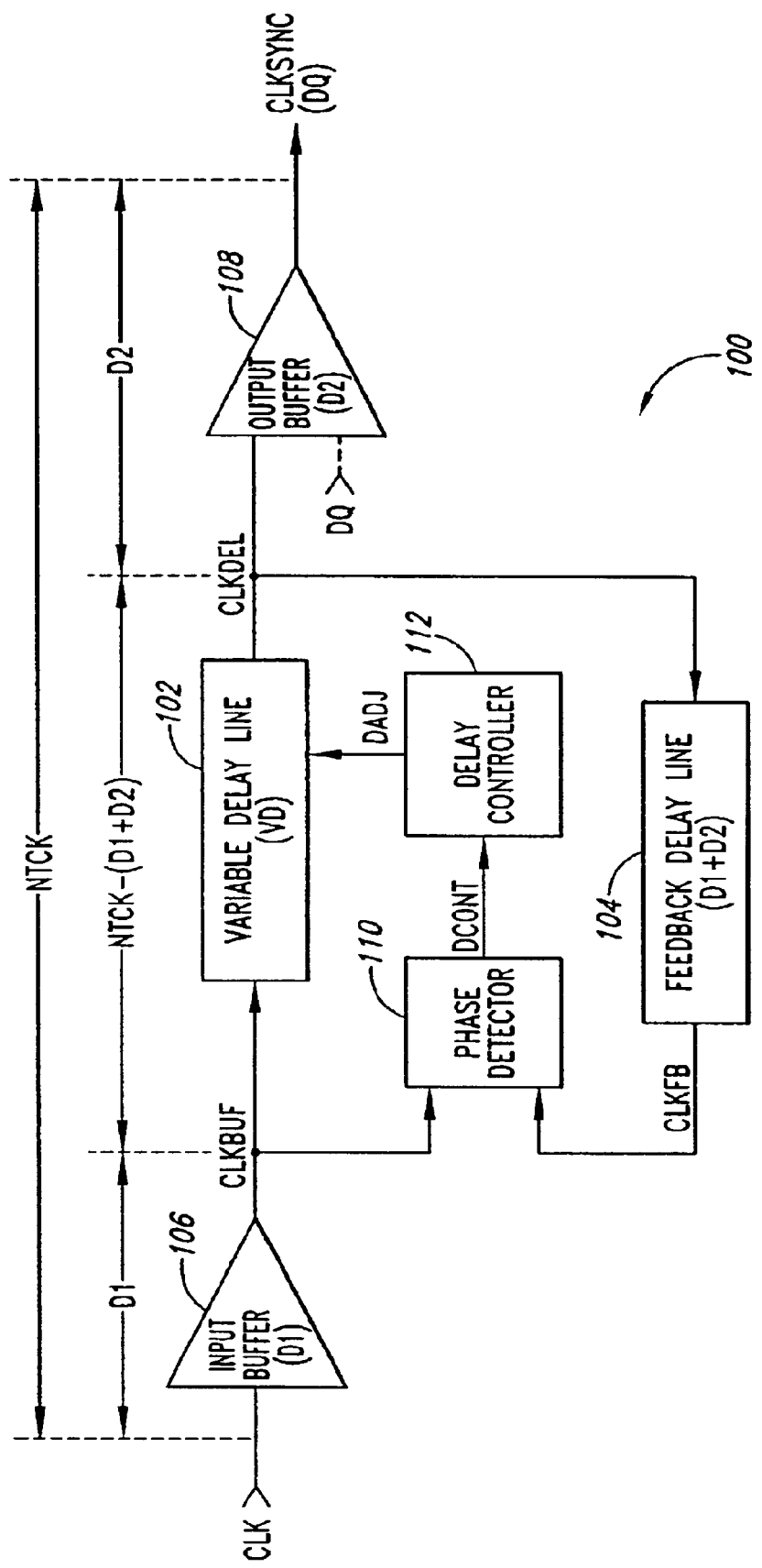
FIG. 1 is a functional block diagram of a conventional delay-locked loop.
Figure 2:
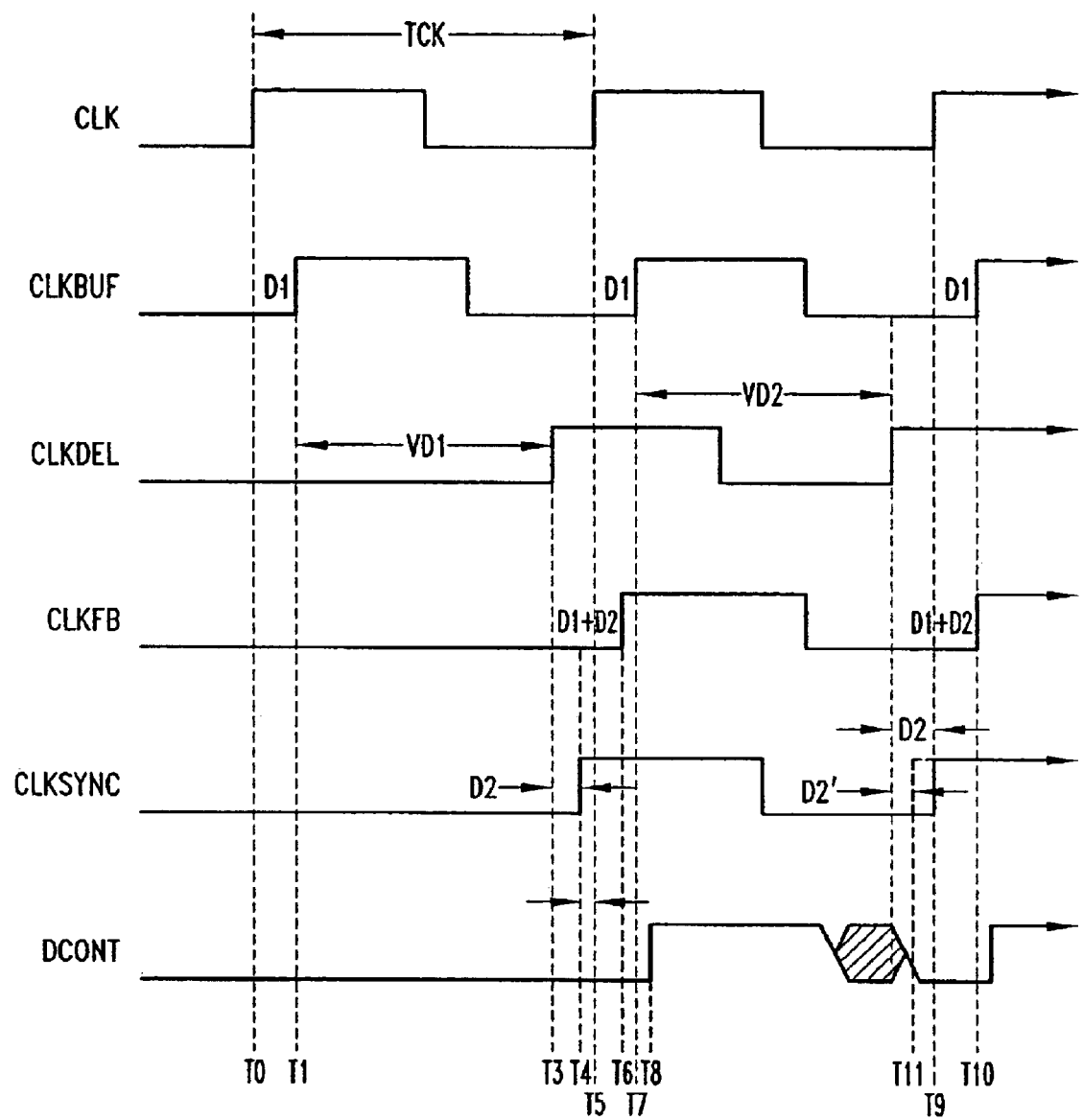
FIG. 2 is a signal timing diagram illustrating various signals generated during operation of the delay-locked loop of FIG. 1.

In the delay-locked loop 400, the components 406–414 operate in the same way as previously described for the for the corresponding components in the delay-locked loop 100 of FIG. 1, and thus, for the sake of brevity, the operation of these components will not again be described in detail. The delay-locked loop 400 further includes a mode delay line 416 that generates a mode-delayed clock signal MDCLK in response to the CLKDEL signal, and applies the MDCLK signal to the feedback delay line 414. The mode delay line 416 receives the DS bit from the extended load mode register 404, and delays the MDCLK signal relative to the CLKDEL signal by a mode delay MD having a value that is determined by the state of the DS bit. When the DS bit equals a logic 0, the delay MD is approximately zero and the mode delay line 416 outputs the CLKDEL signal as the MDCLK signal. In contrast, when the DS bit equals a logic 1, the mode delay line 416 outputs the MDCLK signal having the delay MD relative to the CLKDEL signal. As will be discussed in more detail below, the delay MD can be either a positive or negative value. The state of the DS bit defines the mode of operation of the output buffer 402, and when the DS bit equals a logic 0 and a logic 1 the output buffer operates in the full-drive and reduced-drive modes, respectively, as will also be explained in more detail below.

In operation, the delay-locked loop 400 operates in a full-drive and reduced-drive mode of operation to synchronize the CLK and CLKSYNC signals, as will now be explained in more detail. To place the delay-locked loop 400 in the fill-drive mode, the DS bit having a logic 0 is stored in the extended load mode register 404. As will be appreciated by those skilled in the art, the extended load mode register 404 is in the DDR SDRAM or other integrated circuit containing the delay-locked loop 400. The manner in which the DS bit is stored in the register 404 when the delay-locked loop 400 is contained in a DDR SDRAM will be described in more detail below. When the DS bit is a 0, the output buffer 402 has a delay D2 and the mode delay line 416 outputs the CLKDEL signal as the MDCLK signal. In this situation, the mode delay line 416 adds no additional delay and a delay-locked loop 400 operates as previously described for the delay-locked loop 100 of FIG. 1 to synchronize the CLK and CLKSYNC signals. Thus, during the full-drive mode the variable delay VD of the variable delay line 408 is adjusted until it equals NTCK−(D1+D2), as shown in FIG. 4 and as previously described for the delay-locked loop 100.

To place the delay-locked loop 400 in the reduced-drive mode, the DS bit having a logic 1 is stored in the extended load mode register 404. When the DS bit is a 1, the output buffer 402 has a delay D2' and the mode delay line 416 outputs the MDCLK signal having the delay MD relative to the CLKDEL signal. In response to the delay MD being added in the feedback path between the CLKDEL signal and the CLKFB signal, the delay-locked loop 400 adjusts the variable delay VD of the variable delay line 408 until the CLKFB and CLKBUF signals are once again locked, which occurs when the variable delay VD of the variable delay line 408 equals NTCK−(D1+D2+MD). In the reduced-drive mode, the mode delay line 416 introduces the delay MD which, when added to the delay D2 of the output buffer 402 for the full-drive mode, equals the delay D2' of the output buffer in the reduce-drive mode. Thus, the variable delay VD of the variable delay line 408 equals NTCK−(D1+D2+MD), where D2'=D2+MD. In this way, the delay-locked loop 400 adjusts the variable delay VD of the CLKDEL signal to synchronize the CLK and CLKSYNC signals during the reduced-drive mode.

Figure 5:
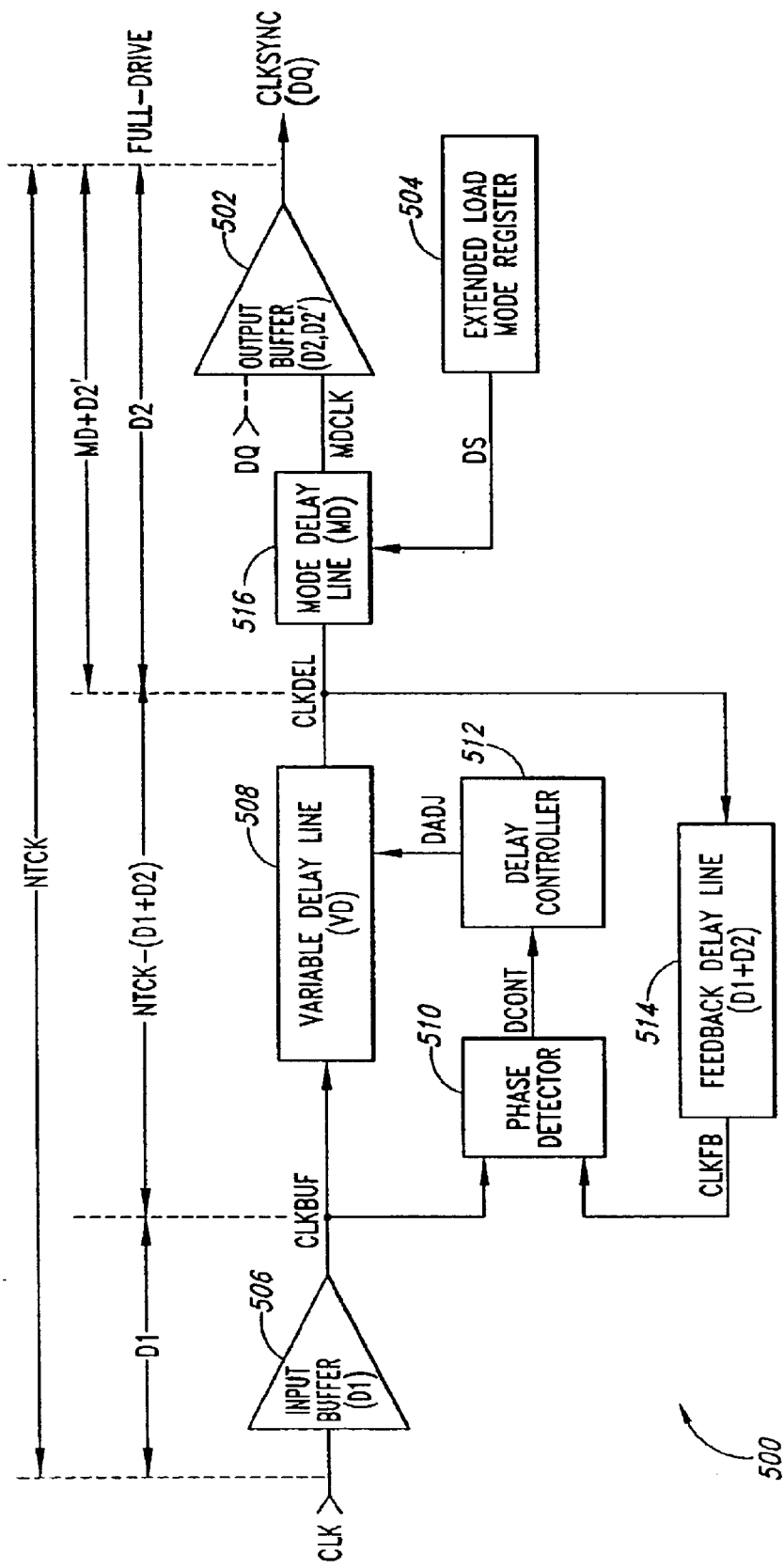
FIG. 5 is a functional block diagram illustrating a delay-locked loop for adjusting a mode delay in response to an output buffer operating in either a full-drive or reduced-drive mode of operation according to another embodiment of the present invention.

FIG. 5 is a functional block diagram illustrating another embodiment of a delay-locked loop 500 that synchronizes an external clock signal CLK signal and a synchronized clock signal CLKSYNC during full- and reduced-drive modes of operation of an output buffer 502. More specifically, the delay-locked loop 500 compensates for variations in a delay D2 of the output buffer 502 between modes by adding a mode delay MD in series with the delay D2 of the output buffer in response to the state of an output drive strength bit DS stored in an extended load mode register 504, as will now be explained in more detail below. In the delay-locked loop 500, the components 502–514 operate in the same way as previously described for the corresponding components in the delay-locked loop 400 of FIG. 4, and thus, for the sake of brevity, the operation of these components will not again be described in detail.

Similar to the delay-locked loop 400 of FIG. 4, the delay-locked loop 500 includes a mode delay line 516 that receives the DS bit from the extended load mode register 504, but instead of being coupled in the feedback path between the CLKDEL and CLKFB signals as in the delay-locked loop 400, the mode delay line 516 is coupled between the output of the variable delay line 508 and the input of the output buffer 502. The mode delay line 516 operates in the same way as the mode delay line 416 to generate a mode delayed clock signal MDCLK in response to the CLKDEL signal, and applies the MDCLK signal to the input of the output buffer 502. The mode delay line 516 delays the MDCLK signal relative to the CLKDEL signal by a mode delay MD having a value that is determined by the state of the DS bit from the extended load mode register 504. When the DS bit equals a logic 0, the delay MD is approximately zero and the mode delay line 516 outputs the CLKDEL signal as the MDCLK signal. In contrast when, the DS bit equals a logic 1, the mode delay line 516 outputs the MDCLK signal having the delay MD relative to the CLKDEL signal. Once again, the state of the DS bit defines the mode of operation of the output buffer 502, and when the DS bit equals a logic 0 and a logic 1 the output buffer operates in the full-drive and reduced-drive modes, respectively.

In operation, the delay-locked loop 500 operates in a full-drive and reduced-drive mode of operation to synchronize the CLK and CLKSYNC signals, as will now be explained in more detail. To place the delay-locked loop 500 in the full-drive mode, the DS bit having a logic 0 is stored in the extended load mode register 504. When the DS bit is a 0, the output buffer 502 has a delay D2 and the mode delay line 516 outputs the CLKDEL signal as the MDCLK signal. In this situation, the mode delay line 516 adds no additional delay and a delay-locked loop 500 operates as previously described for the delay-locked loop 100 of FIG. 1 to synchronize the CLK and CLKSYNC signals. Thus, during the full-drive mode the variable delay VD of the variable delay line 508 is adjusted until it equals NTCK−(D1+D2), as shown in FIG. 5 and as previously described for the delay-locked loop 100.

To place the delay-locked loop 500 in the reduced-drive mode, the DS bit having a logic 1 is stored in the extended load mode register 504. When the DS bit is a 1, the output buffer 502 has a delay D2' and the mode delay line 516 outputs the MDCLK signal having the delay MD relative to the CLKDEL signal. The delay MD results in the MDCLK that is applied to the output buffer 502 being shifted by the delay MD relative to the CLKDEL signal. As a result, the delay between the CLKDEL signal and the CLKSYNC signal output from the buffer 502 equals MD+D2' during the reduced-drive mode. The delay MD introduced by the mode delay line 516 during the reduced-drive mode has a value so that MD+D2'=D2 to compensate for the variation in the delay of the output buffer 502. Thus, in the reduced-drive mode, the mode delay line 516 introduces the delay MD which, when added to the delay D2' of the output buffer 502, equals the delay D2 for the output buffer in the full-drive mode. In this way, the delay-locked loop 500 adjusts the variable delay VD of the CLKDEL signal to NTCK−(D1+D2) and the mode delay line 516 introduces the delay MD to compensate for variations in the delay of the output buffer 502 between the full- and reduced-drive modes. Once again, the value of the delay MD introduced by the mode delay line 516 may be positive or negative.

Figure 6:
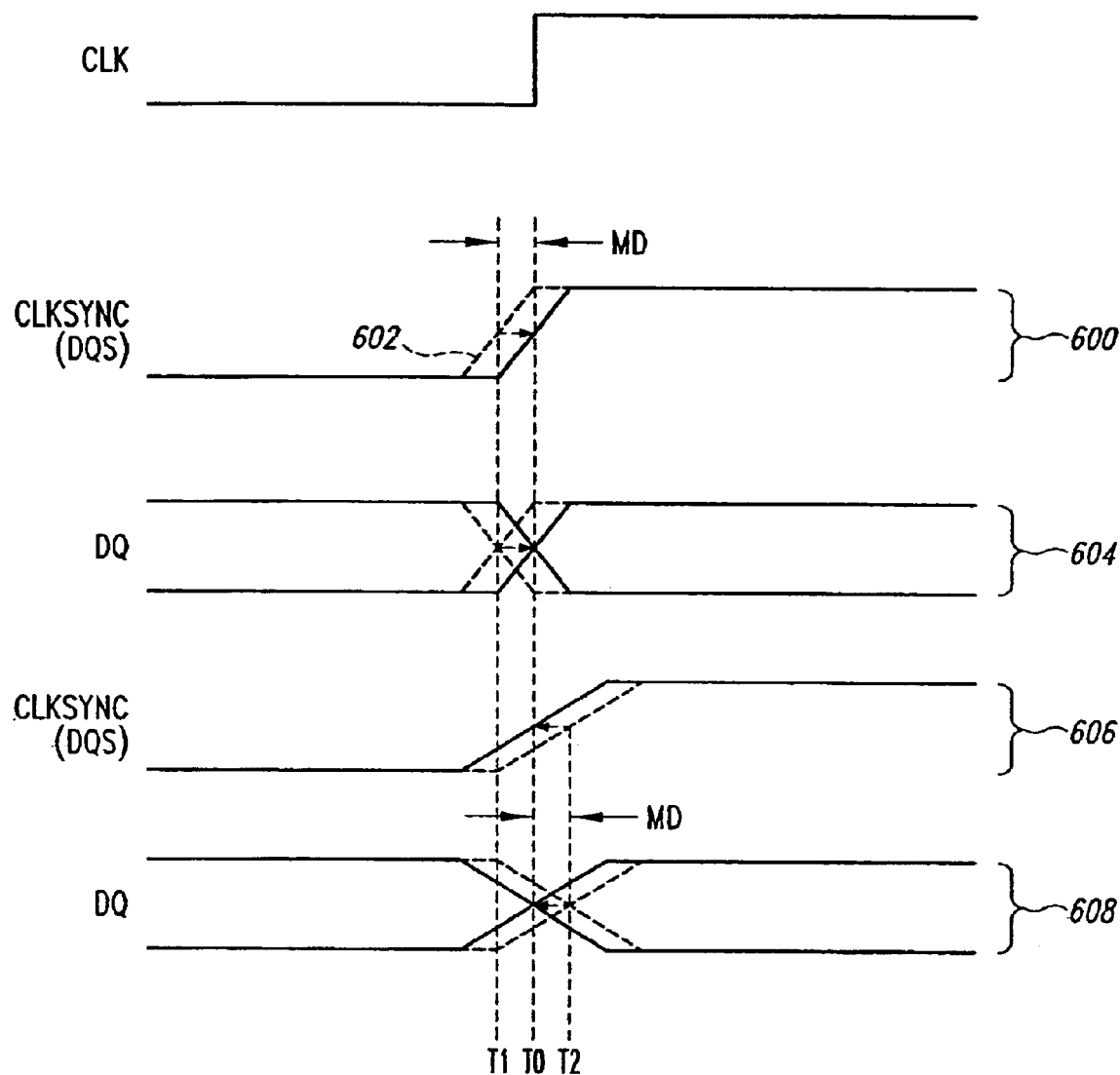
FIG. 6 is a signal timing diagram illustrating the operation of the delay-locked loop's of FIG. 4 and FIG. 5 in adjusting the delay of the delayed clock signal.

FIG. 6 is a signal timing diagram illustrating the operation of the delay-locked loops 400 and 500 of FIGS. 4 and 5, respectively, in introducing the mode delay MD to thereby synchronize the CLK and CLKSYNC signals during the reduced-drive mode of operation of the output buffers 402, 502. In FIG. 6, the CLK signal transitions high at a time the T0, and a signal diagram 600 illustrates that without the addition of the mode delay MD, the CLKSYNC signal would transition high at a time T1 prior to the timing T0 as indicated by the dotted line 602. In this situation, the delay D2' of the output buffer 402, 502 in the reduced-drive mode is less than the delay D2 of the output buffer during the full-drive mode, and the CLK and CLKSYNC signals are not synchronized. The delay-locked loops 400, 500 introduce the mode delay MD to thereby shift the transition of the CLKSYNC signal to the time T0 and in synchronism with the CLK signal. The same type of adjustment is illustrated by the signal diagram 604 for the situation where the output buffers 402, 502 output data signals DQ in response to be applied CLKDEL, MDCLK signals. Similarly, signal diagrams 606 and 608 illustrate the operation of the delay-locked loops 400, 500 in introducing the mode delay MD to compensate for the situation where the delay of the output buffer 402, 502 in the reduced-drive mode is greater than the delay D2 of the output buffer during the full-drive mode. In this situation, the mode delay lines 416, 516 at a delay MD to shift the CLKSYNC and DQ signals from a time T2 to the time T0 and in synchronism with the CLK signal.

It should be noted that the mode delay MD introduced by the mode delay lines 416, 516 has the same magnitude but different polarities in the delay-locked loops 400 and 500. For example, in the situation depicted by the signal diagram 600 in FIG. 6, the mode delay line 516 introduces a positive mode delay MD having a value D2–D2'. In contrast, the mode delay line 416 introduces a negative mode delay MD having the magnitude D2–D2', which causes the CLKFB signal to have a positive phase shift relative to the CLKBUF signal and thereby causes the phase detector 410 and delay controller 412 to increase the variable delay VD of the CLKDEL signal until the CLK and CLKSYNC signals are synchronized. In this situation, the delay-locked loop 400 will consume less power than the delay-locked loop 500 due to less of the variable delay line 408 being utilized relative to the variable delay line 508, as will be appreciated by those skilled in the art. In the situation depicted by the signal diagrams 606 and 608, the mode delay line 516 introduces a negative the mode delay MD having the value D2–D2', while the mode delay line 416 introduces a positive mode delay having the same magnitude. In this situation, the delay-locked loop 400 consumes more power than the delay-locked loop 500 due to more of the variable delay line 408 being utilized relative to the variable delay line 508.

Figure 7:
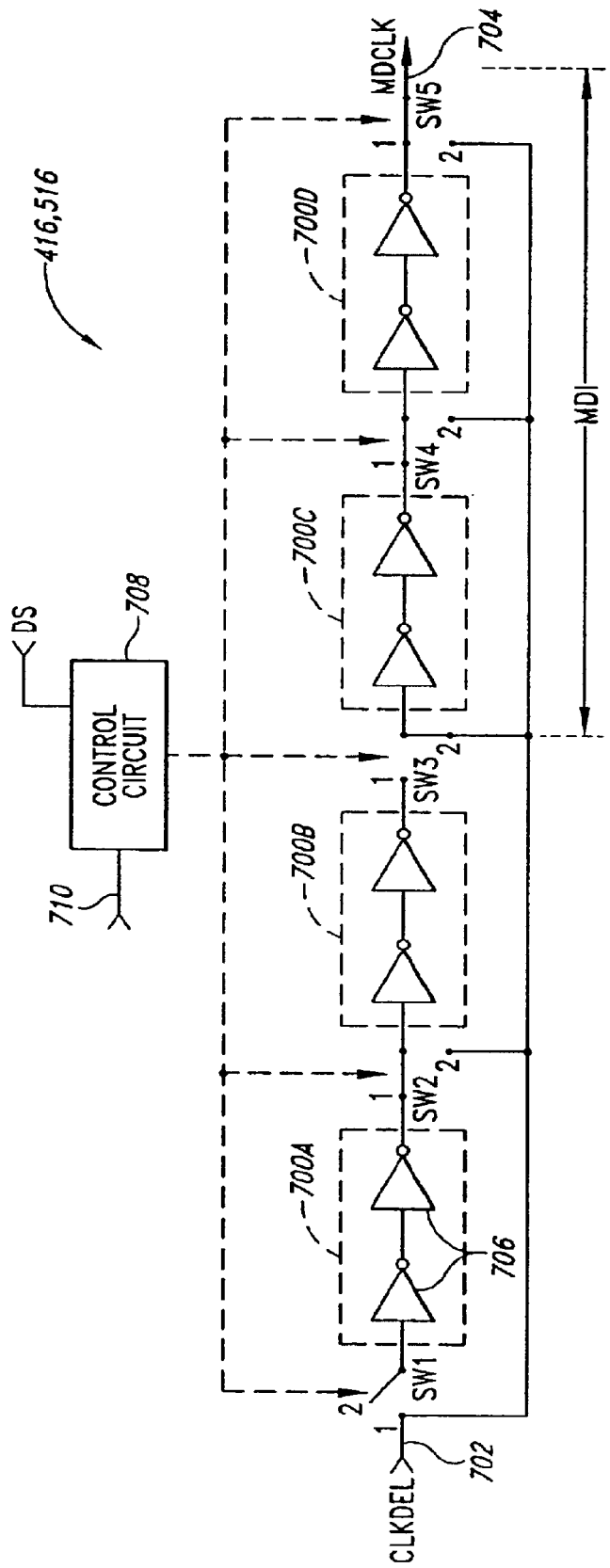
FIG. 7 is a functional block diagram and schematic illustrating one embodiment of the model delay line of FIGS. 4 and 5.

FIG. 7 is a schematic and a functional block diagram illustrating one embodiment of the mode delay lines 416, 516 in the delay-locked loops 400, 500 of FIGS. 4 and 5. In the following description, the embodiment depicted in FIG. 7 will be referred to as the mode delay line 416 simply for ease of description. In the embodiment of FIG. 7, the mode delay line 416 includes a plurality of delay stages 700A–D coupled in series through a plurality of switches SW1–5 between an input terminal 702 adapted to receive the CLKDEL signal and an output terminal 704 on which the MDCLK signal is developed. Each delay stage 700A–D is formed by two series-connected inverters 706. A control circuit 708 controls the positions of the switches SW1–5 in response to the state of the DS bit and a plurality of control signals 710, which are applied by other circuitry in a DDR SDRAM or other integrated circuit containing the delay-locked loop 400 (FIG. 4). The control circuit 708 adjusts the magnitude of the mode delay MD in response to the control signals 710 by selectively positioning the switches SW1–5 between the positions 1, 2 as shown.

The control circuit 708 allows the DDR SDRAM containing the delay-locked loop 400 and mode delay line 416 to be characterized during manufacture and testing to determine the appropriate magnitude and polarity of the required mode delay MD. Typically, this would be done by loading a logic 1 for the DS bit into the extended load mode register 404 and thereby placing the output buffer 402 in the reduced-drive mode of operation. The transitions of the CLKSYNC and DQ signals would thereafter be monitored to determine whether the transitions of the signals comply with the specified access time TAC parameters specified for the memory device. When these transitions are initially monitored, the control circuit 708 initially controls the switches SW1–5 to cause the mode delay MD to have an initial value that may thereafter be increased or decreased as required. For example, the control circuit 708 may initially place the switches SW1–5 in the positions illustrated in FIG. 7 so that the applied CLKDEL signal bypasses the delay stages 700A and 700B and is applied through the stages 700C and 700D to generate the MDCLK signal. At this point, the mode delay MD has an initial value MDI determined by the delay of the delay stages 700C–D. The transitions of the CLKSYNC and DQ signals are thereafter monitored and the control signals 710 applied to the control circuit 708 which, in turn, positions the switches SW1–5 to adjust the initial mode delay MDI as required. For example, if the initial mode delay MDI is to be increased, the switch SW3 is moved to position 1 while the switch SW2 is moved to position 2 to thereby increase the initial mode delay MDI by the delay of the delay stage 700B. In contrast, if the initial mode delay MDI is to be decreased, the switch SW3 is moved to position 1 while the switch SW4 is moved to position 2 to thereby decrease the initial mode delay MDI by the delay of the delay stage 700C.

Figure 8:
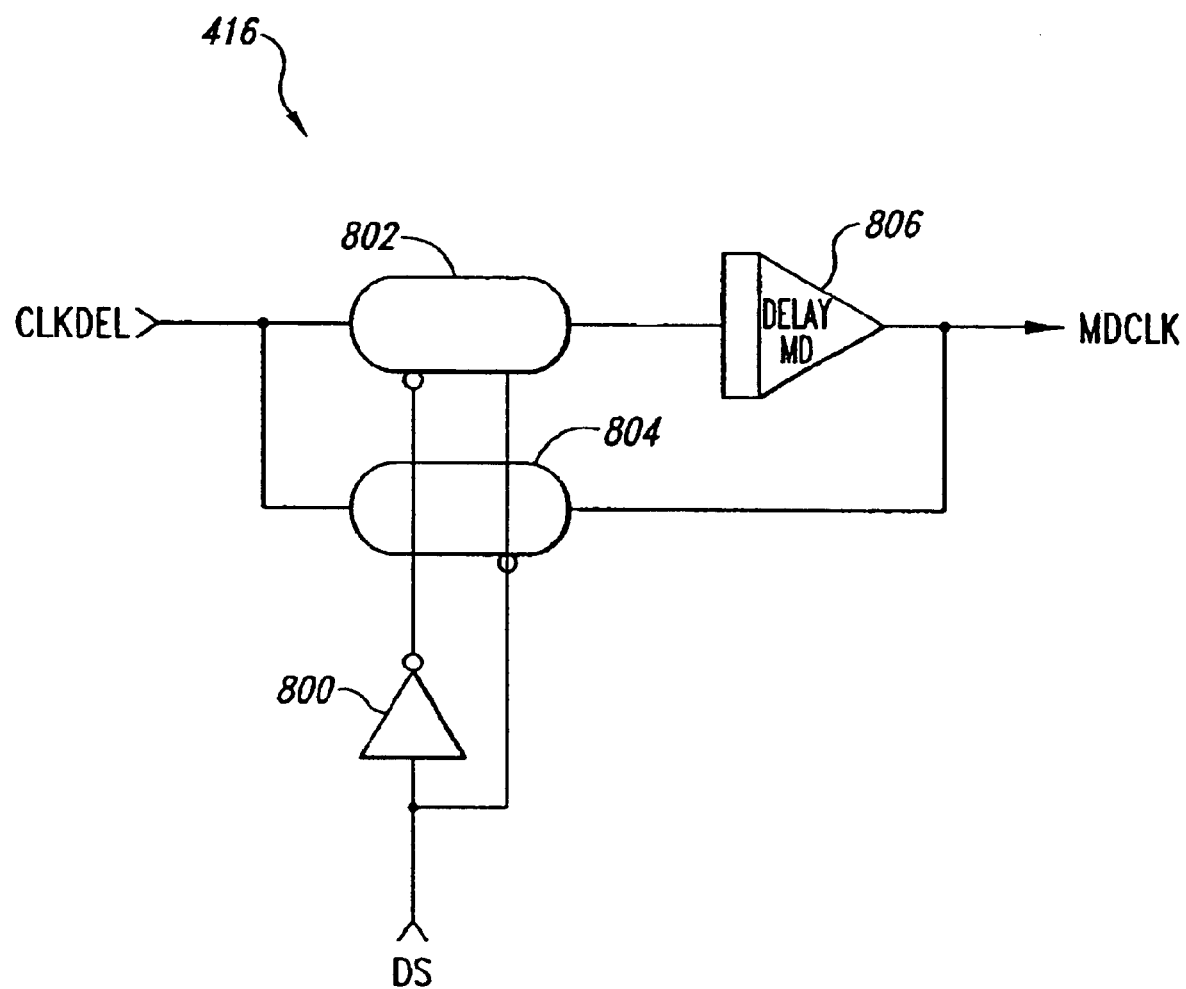
FIG. 8 is a schematic illustrating another embodiment of the model delay line of FIGS. 4 and 5.

FIG. 8 is a schematic illustrating another embodiment of the mode delay lines 416 and 516 of FIGS. 4 and 5 that introduce the mode delay MD having a fixed value. In the embodiment of FIG. 8, the DS bit is applied through an inverter 800 to alternately activate complementary transmission gates 802 and 804. When the DS bit is a logic 0, which defines the full-drive mode of operation, if the transmission gate 804 is activated and applies the CLKDEL signal as the MDCLK signal having a negligible mode delay MD (assuming the delay through the transmission gate 804 is negligible). In contrast, when the DS bit is a logic 1, which defines the reduced-drive mode of operation, the transmission gate 802 is activated and applies the CLKDEL signal through a fixed delay circuit 806 to generate the MDCLK signal having a fixed mode delay MD relative to the CLKDEL signal.

Figure 9:
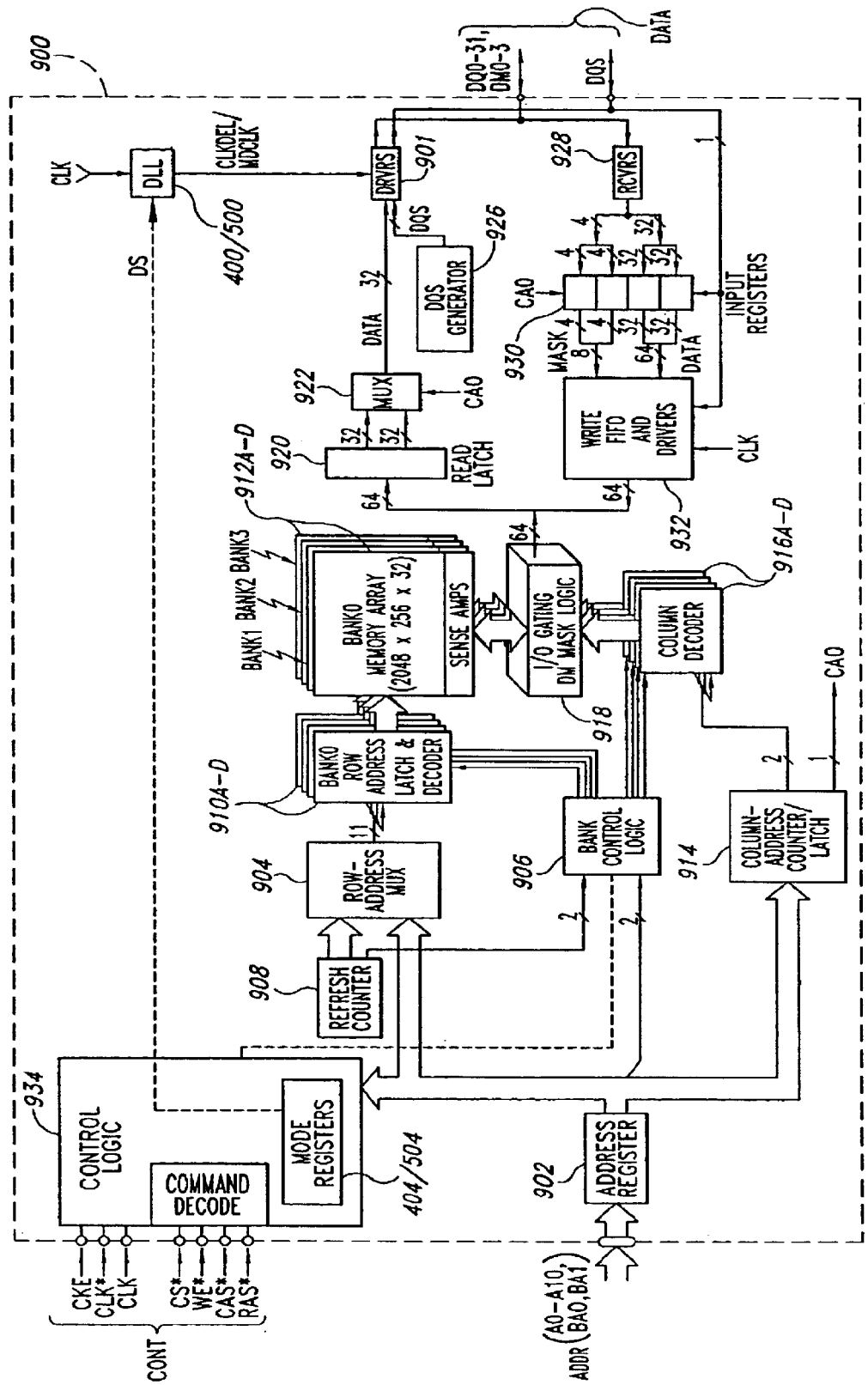
FIG. 9 is a functional block diagram of a DDR SDRAM including the delay-locked loop of FIG. 4 and/or the delay-locked loop of FIG. 5.

FIG. 9 is a functional block diagram of a memory device 900 including the delay-locked loop 400 of FIG. 4 and/or the delay-locked loop 500 of FIG. 5 to generate the clocks signals CLKDEL or MDCLK to clock data drivers 901, which correspond to the output buffers 402, 502, during full-drive and reduced-drive modes of operation of the data drivers, as will now be explained in more detail. The data drivers 901 output data signals DQ0–DQ31 and a data strobe signal DQS on a data bus DATA in synchronism with an applied external clock signal CLK in response to the CLKDEL/MDCLK signal from the delay-locked loop 400/500. The memory device 900 in FIG. 9 is a double-data rate (DDR) synchronous dynamic random access memory ("SDRAM"), although as previously mentioned the principles described herein are applicable to any memory device that may include a delay-locked loop or other clock synchronization circuit for synchronizing internal and external signals, such as conventional synchronous DRAMs (SDRAMs), as well as packetized memory devices like SLDRAMs and RDRAMs, and are equally applicable to any integrated circuit that must synchronize internal and external clocking signals.

The memory device 900 includes an address register 902 that receives row, column, and bank addresses over an address bus ADDR, with a memory controller (not shown) typically supplying the addresses. The address register 902 receives a row address and a bank address that are applied to a row address multiplexer 904 and bank control logic circuit 906, respectively. The row address multiplexer 904 applies either the row address received from the address register 902 or a refresh row address from a refresh counter 908 to a plurality of row address latch and decoders 910A–D. The bank control logic 906 activates the row address latch and decoder 910A–D corresponding to either the bank address received from the address register 902 or a refresh bank address from the refresh counter 908, and the activated row address latch and decoder latches and decodes the received row address. In response to the decoded row address, the activated row address latch and decoder 910A–D applies various signals to a corresponding memory bank 912A–D to thereby activate a row of memory cells corresponding to the decoded row address. Each memory bank 912A–D includes a memory-cell array having a plurality of memory cells arranged in rows and columns, and the data stored in the memory cells in the activated row is stored in sense amplifiers in the corresponding memory bank. The row address multiplexer 904 applies the refresh row address from the refresh counter 908 to the decoders 910A–D and the bank control logic circuit 906 uses the refresh bank address from the refresh counter when the memory device 900 operates in an auto-refresh or self-refresh mode of operation in response to an auto- or self-refresh command being applied to the memory device 900, as will be appreciated by those skilled in the art.

A column address is applied on the ADDR bus after the row and bank addresses, and the address register 902 applies the column address to a column address counter and latch 914 which, in turn, latches the column address and applies the latched column address to a plurality of column decoders 916A–D. The bank control logic 906 activates the column decoder 916A–D corresponding to the received bank address, and the activated column decoder decodes the applied column address. Depending on the operating mode of the memory device 900, the column address counter and latch 914 either directly applies the latched column address to the decoders 916A–D, or applies a sequence of column addresses to the decoders starting at the column address provided by the address register 902. In response to the column address from the counter and latch 914, the activated column decoder 916A–D applies decode and control signals to an I/O gating and data masking circuit 918 which, in turn, accesses memory cells corresponding to the decoded column address in the activated row of memory cells in the memory bank 912A–D being accessed.

Figure 3:
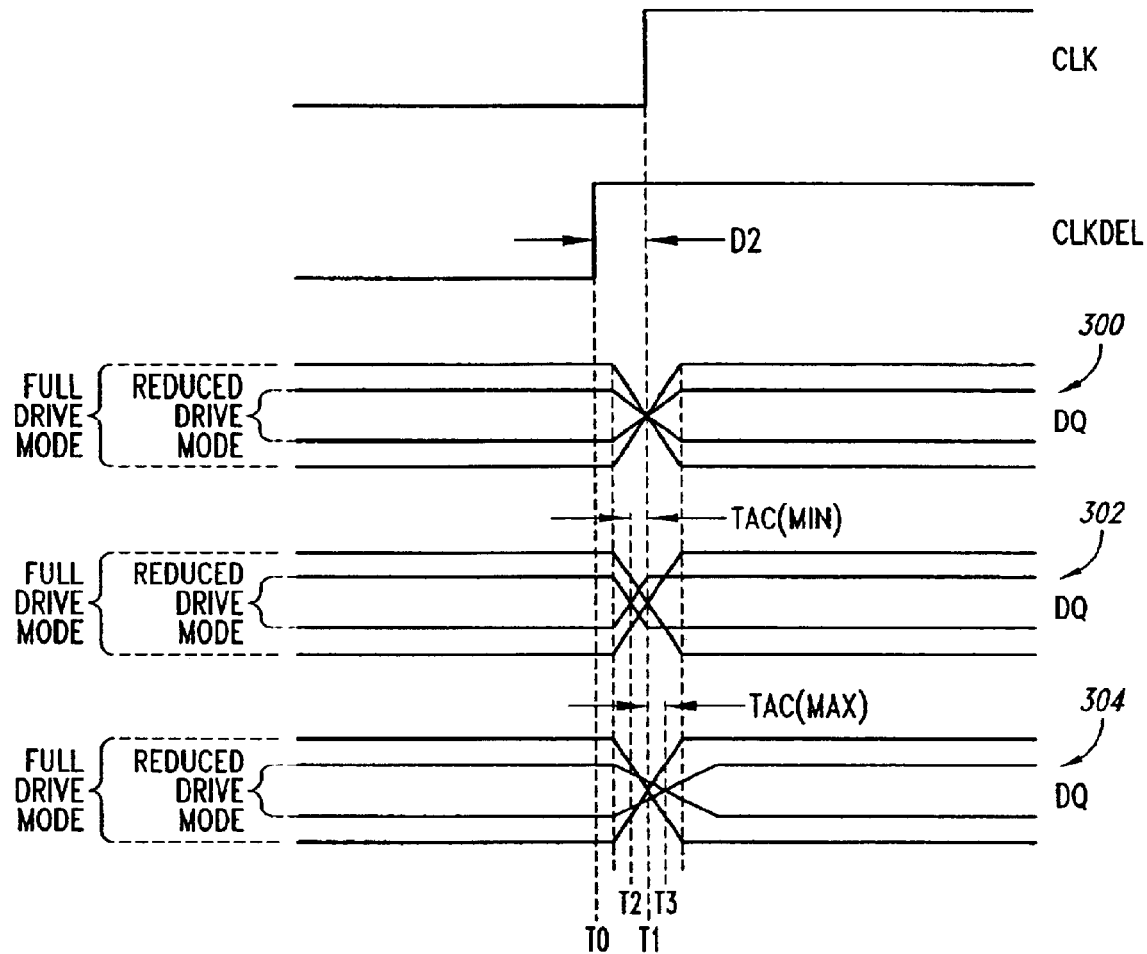
FIG. 3 is a signal timing diagram illustrating the operation of the output buffer of FIG. 1 during full-drive and reduced-drive modes of operation when the buffer is contained in a DDR SDRAM.

During data read operations, data being read from the addressed memory cells is coupled through the I/O gating and data masking circuit 918 to a read latch 920. The I/O gating and data masking circuit 918 supplies N bits of data to the read latch 920, which then applies two N/2 bit words to a multiplexer 922. In the embodiment of FIG. 3, the circuit 918 provides 64 bits to the read latch 920 which, in turn, provides two 32 bits words to the multiplexer 922. The data driver 901 sequentially receives the N/2 bit words from the multiplexer 922, and also receives a data strobe signal DQS from a strobe signal generator 926 and the delayed clock signal CLKDEL/MDCLK from the delay-locked loop 300/500. The DQS signal is used by an external circuit such as a memory controller (not shown) in latching data from the memory device 900 during read operations. In response to the delayed clock signal CLKDEL/MDCLK the data driver 901 sequentially outputs the received N/2 bits words as a corresponding data word DQ, each data word being output in synchronism with a rising or falling edge of a CLK signal that is applied to clock the memory device 900. The data driver 901 also outputs the data strobe signal DQS having rising and falling edges in synchronism with rising and falling edges of the CLK signal, respectively. Each data word DQ and the data strobe signal DQS collectively define the data bus DATA. As will be appreciated by those skilled in the art, the CLKDEL/MDCLK signal from the delay-locked loop 400/500 is a delayed version of the CLK signal, and the delay-locked loop adjusts the delay of the CLKDEL/MDCLK signal relative to the CLK signal to ensure that the DQS signal and the DQ words are placed on the DATA bus in synchronism with the CLK signal during both full-drive and reduced-drive modes of operation of the data drivers 901, as previously described. The DATA bus also includes masking signals DM0-M, which will be described in more detail below with reference to data write operations.

During data write operations, an external circuit such as a memory controller (not shown) applies N/2 bit data words DQ, the strobe signal DQS, and corresponding data masking signals DM0-X on the data bus DATA. A data receiver 928 receives each DQ word and the associated DM0-X signals, and applies these signals to input registers 930 that are clocked by the DQS signal. In response to a rising edge of the DQS signal, the input registers 930 latch a first N/2 bit DQ word and the associated DM0-X signals, and in response to a falling edge of the DQS signal the input registers latch the second N/2 bit DQ word and associated DM0-X signals. The input register 930 provides the two latched N/2 bit DQ words as an N-bit word to a write FIFO and driver 932, which clocks the applied DQ word and DM0-X signals into the write FIFO and driver in response to the DQS signal. The DQ word is clocked out of the write FIFO and driver 932 in response to the CLK signal, and is applied to the I/O gating and masking circuit 918. The I/O gating and masking circuit 918 transfers the DQ word to the addressed memory cells in the accessed bank 912A–D subject to the DM0-X signals, which may be used to selectively mask bits or groups of bits in the DQ words (i.e., in the write data) being written to the addressed memory cells.

A control logic and command decoder 934 receives a plurality of command and clocking signals over a control bus CONT, typically from an external circuit such as a memory controller (not shown). The command signals include a chip select signal CS*, a write enable signal WE*, a column address strobe signal CAS*, and a row address strobe signal RAS*, while the clocking signals include a clock enable signal CKE* and complementary clock signals CLK, CLK*, with the "*" designating a signal as being active low. The command signals CS*, WE*, CAS*, and RAS* are driven to values corresponding to a particular command, such as a read, write, or load mode register command. In response to the clock signals CLK, CLK*, the command decoder 934 latches and decodes an applied command, and generates a sequence of clocking and control signals that control the components 902–932 to execute the function of the applied command. The clock enable signal CKE enables clocking of the command decoder 934 by the clock signals CLK, CLK*. The command decoder 934 latches command and address signals at positive edges of the CLK, CLK* signals (i.e., the crossing point of CLK going high and CLK* going low), while the input registers 930 and data drivers 901 transfer data into and from, respectively, the memory device 900 in response to both edges of the data strobe signal DQS and thus at double the frequency of the clock signals CLK, CLK*. This is true because the DQS signal has the same frequency as the CLK, CLK* signals. The memory device 900 is referred to as a double-data-rate device because the data words DQ being transferred to and from the device are transferred at double the rate of a conventional SDRAM, which transfers data at a rate corresponding to the frequency of the applied clock signal. The detailed operation of the control logic and command decoder 934 in generating the control and timing signals is conventional, and thus, for the sake of brevity, will not be described in more detail.

The control logic and command decoder 934 also includes a load mode register, which includes the extended load mode register 404/504 previously discussed with reference to FIGS. 4 and 5. An external circuit, such as a memory controller or memory tester, applies the command signals CS*, WE*, CAS*, and RAS* corresponding to a load mode register command to control the state of the DS bit contained in the extended load mode register 404/504. Moreover, during characterization of the memory device 900 in the reduced-drive mode as previously discussed with reference to FIG. 7, the control logic and command decoder 934 supplies the control signals 710 to the control circuit 708 (see FIG. 7) to adjust the value of the mode delay MD to the required value.

Figure 10:
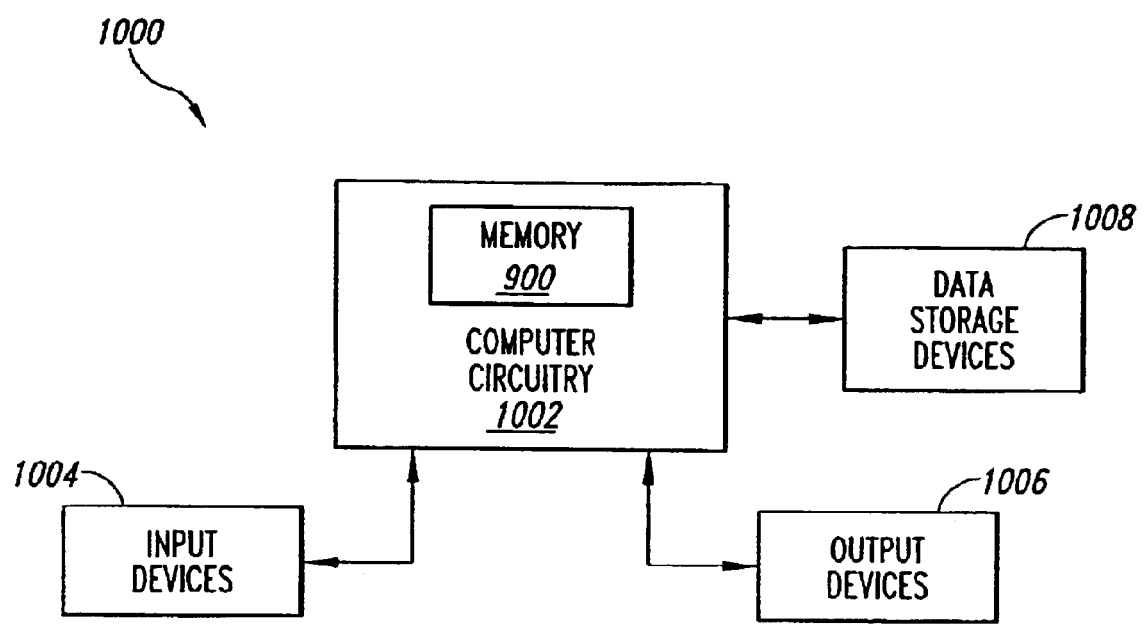
FIG. 10 is a functional block diagram illustrating a computer system including the DDR SDRAM of FIG. 9.

FIG. 10 is a block diagram of a computer system 1000 including computer circuitry 1002 including the memory device 900 of FIG. 9. Typically, the computer circuitry 1002 is coupled through address, data, and control buses to the memory device 900 to provide for writing data to and reading data from the memory device. The computer circuitry 1002 includes circuitry for performing various computing functions, such as executing specific software to perform specific calculations or tasks. In addition, the computer system 1000 includes one or more input devices 1004, such as a keyboard or a mouse, coupled to the computer circuitry 1002 to allow an operator to interface with the computer system. Typically, the computer system 1000 also includes one or more output devices 1006 coupled to the computer circuitry 1002, such as output devices typically including a printer and a video terminal. One or more data storage devices 1008 are also typically coupled to the computer circuitry 1002 to store data or retrieve data from external storage media (not shown). Examples of typical storage devices 1008 include hard and floppy disks, tape cassettes, compact disk read-only (CD-ROMs) and compact disk read-write (CD-RW) memories, and digital video disks (DVDs).

It is to be understood that even though various embodiments and advantages of the present invention have been set forth in the foregoing description, the above disclosure is illustrative only, and changes may be made in detail, and yet remain within the broad principles of the invention. For example, many of the components described above may be implemented using either digital or analog circuitry, or a combination of both, and also, where appropriate, may be realized through software executing on suitable processing circuitry. Therefore, the present invention is to be limited only by the appended claims.

What is claimed is:

1. A memory device, comprising:
   an address bus;
   a control bus;
   a data bus;
   an address decoder coupled to the address bus;
   a read/write circuit coupled to the data bus;
   a control circuit coupled to the control bus;
   a memory-cell array coupled to the address decoder, control circuit, and read/write circuit; and
   a clock synchronization circuit coupled at least to the read/write circuit and configured to receive an input clock signal, the clock synchronization circuit comprising,
      a variable delay line configured to receive an input clock signal and operable to generate a delayed clock signal responsive to the input clock signal, the delayed clock signal having a delay relative to the input clock signal that is a function of a delay control signal;
      a comparison circuit coupled to the variable delay line, the comparison circuit operable to generate the delay control signal in response to the relative phases of the delayed clock signal and the input clock signal;
      an output mode circuit configured to receive a output drive strength signal and coupled to the variable delay line and the comparison circuit, the mode circuit operable to adjust the value of the delay control signal to provide a delayed clock signal having a first delay responsive to the output drive strength signal having a first state, and operable to adjust the value of the delay control signal to provide a delayed clock signal having a second delay responsive to the output drive strength signal having a second state; and
      an output circuit coupled to the variable delay line and the output mode circuit, the output circuit operable in a first output drive strength mode responsive to the output drive strength signal having the first state to generate an output signal responsive to the delayed clock signal having the first delay, and operable in a second output drive strength mode responsive to the output drive strength signal having the second state to generate the output signal responsive to the delayed clock signal having the second delay.

2. The memory device of claim 1 wherein the memory device comprises a DDR SDRAM and the delayed clock signal is applied to clock an output driver contained in the read/write circuit.

3. A memory device, comprising:
   an address bus;
   a control bus;
   a data bus;
   an address decoder coupled to the address bus;
   a read/write circuit coupled to the data bus;
   a control circuit coupled to the control bus;
   a memory-cell array coupled to the address decoder, control circuit, and read/write circuit; and
   a delay-locked loop coupled to at least the read/write circuit and being configured to receive an input clock signal, the delay-locked loop comprising,
      a variable delay line configured to receive an input clock signal and operable to generate a delayed clock signal responsive to the input clock signal, the delayed clock signal having a delay relative to the input clock signal and the variable delay circuit operable to control the value of the delay responsive to a delay control signal;
      a comparison circuit coupled to the variable delay line, the comparison circuit operable to generate the delay control signal in response to the relative phases of the delayed and input clock signals; and
      a mode delay line configured to receive an output drive strength signal and coupled to the variable delay line, the mode delay line generating a mode delayed clock signal having a mode delay relative to the delayed clock signal and the mode delay being a function of the output drive strength signal.

4. The memory device of claim 3 wherein the memory device comprises DDR SDRAM and the delayed clock signal is applied to clock an output driver contained in the read/write circuit.

5. A computer system, comprising:
a data input device;
a data output device;
a processor coupled to the data input and output devices; and
a memory device coupled to the processor, the memory device comprising,
  an address bus;
  a control bus;
  a data bus;
  an address decoder coupled to the address bus;
  a read/write circuit coupled to the data bus;
  a control circuit coupled to the control bus;
  a memory-cell array coupled to the address decoder, control circuit, and read/write circuit; and
  a clock synchronization circuit coupled at least to the read/write circuit and configured to receive an input clock signal, the clock synchronization circuit comprising,
    a variable delay line configured to receive an input clock signal and operable to generate a delayed clock signal responsive to the input clock signal, the delayed clock signal having a delay relative to the input clock signal that is a function of a delay control signal;
    a comparison circuit coupled to the variable delay line, the comparison circuit operable to generate the delay control signal in response to the relative phases of the delayed clock signal and the input clock signal;
    an output mode circuit configured to receive a output drive strength signal and coupled to the variable delay line and the comparison circuit, the mode circuit operable to adjust the value of the delay control signal to provide a delayed clock signal having a first delay responsive to the output drive strength signal having a first state, and operable to adjust the value of the delay control signal to provide a delayed clock signal having a second delay responsive to the output drive strength signal having a second state; and
    an output circuit coupled to the variable delay line and the output mode circuit, the output circuit operable in a first output drive strength mode responsive to the output drive strength signal having the first state to generate an output signal responsive to the delayed clock signal having the first delay, and operable in a second output drive strength mode responsive to the output drive strength signal having the second state to generate the output signal responsive to the delayed clock signal having the second delay.

6. The memory device of claim 5 wherein the memory device comprises a DDR SDRAM and the delayed clock signal is applied to clock an output driver contained in the read/write circuit.

7. The memory device of claim 1 wherein the clock synchronization circuit comprises a delay-locked loop and the variable delay line comprises a variable delay line circuit coupled to a feedback delay line, and the comparison circuit is further coupled to the feedback delay line.

8. The computer system of claim 5 wherein the clock synchronization circuit comprises a delay-locked loop and the variable delay line comprises a variable delay line circuit coupled to a feedback delay line, and the comparison circuit is further coupled to the feedback delay line.

* * * * *